United States Patent [19] [11] 4,396,438
Goodman [45] Aug. 2, 1983

[54] METHOD OF MAKING CCD IMAGERS
[75] Inventor: Alvin M. Goodman, Princeton, N.J.
[73] Assignee: RCA Corporation, New York, N.Y.
[21] Appl. No.: 297,924
[22] Filed: Aug. 31, 1981
[51] Int. Cl.³ ............... G11C 19/28; H01L 27/14; H01L 21/263
[52] U.S. Cl. ............................ 148/1.5; 29/571; 29/576 B; 148/187; 357/24; 357/91
[58] Field of Search ............... 148/1.5, 187; 29/571, 29/576 B; 357/24 LR, 24 M, 91

[56] References Cited
U.S. PATENT DOCUMENTS

| 3,789,504 | 2/1974 | Jaddam | 29/571 |
|---|---|---|---|
| 3,796,932 | 3/1974 | Amelio et al. | 317/235 |
| 3,796,933 | 3/1974 | Arnett et al. | 317/235 |
| 3,829,884 | 8/1974 | Borel et al. | 357/24 |
| 3,838,438 | 9/1974 | Silversmith et al. | 357/24 |
| 3,896,485 | 7/1975 | Early | 357/24 M |
| 3,906,542 | 9/1975 | Krambeck et al. | 357/24 |
| 3,913,122 | 10/1975 | Borel et al. | 357/24 |
| 3,936,861 | 2/1976 | Borel et al. | 357/24 |
| 3,965,481 | 6/1976 | Esser | 357/24 |
| 4,000,504 | 12/1976 | Berger | 357/23 |
| 4,021,835 | 5/1977 | Etoh et al. | 357/23 |
| 4,028,716 | 6/1977 | Van Santen et al. | 357/24 LR |
| 4,076,557 | 2/1978 | Huang et al. | 148/1.5 |
| 4,108,686 | 8/1978 | Jacobus, Jr. | 148/1.5 |
| 4,207,477 | 6/1980 | Esser | 357/24 |
| 4,280,855 | 7/1981 | Bertin et al. | 148/1.5 |

OTHER PUBLICATIONS
Hill et al., IEEE-Trans. Electron Device, ED-23 (1976), 809.

Primary Examiner—Upendra Roy
Attorney, Agent, or Firm—Birgit E. Morris; Donald S. Cohen

[57] ABSTRACT

The preferred embodiment of the invention disclosed herein provides a CCD imager with reduced striation contrast in its displayed image. The wafer on which the imager is to be formed is lightly doped with atoms of one conductivity type. Before forming the various regions of the imager in the wafer, a layer is first doped with atoms of the same conductivity type so as to have a substantially uniform lateral concentration. This is preferably accomplished by ion implantation and diffusion techniques. Thereafter, an imager is formed in this layer in accordance with any desired technique.

7 Claims, 7 Drawing Figures

METHOD OF MAKING CCD IMAGERS

BACKGROUND OF THE INVENTION

This invention relates to charge coupled devices (hereinafter CCD's) and, more particularly, to CCD arrays used as imagers in television cameras.

CCD imager arrays include a photosensing register, often referred to as an A register, a temporary storage register, often referred to as a B register, and an output register, often referred to as a C register. The A and B registers are usually identical and each includes a plurality of channels formed adjacent one surface of a semiconductor body and the C register includes a single channel with a plurality of stages equal to the number of channels in the A and B registers. In use, the B and C registers are usually masked against light and the A register is associated with a lens that focuses light thereon. Light from an image generates photocharge in the A register which is accumulated in depletion regions formed in the channels, then transferred to the B register whereupon photogeneration can reoccur in the A register. The charge in the B register is transferred into the C register one line at a time from where it is read serially by an output transistor amplifier also formed on the semiconductor body.

One problem with the images displayed from these devices is the presence of ring type bands of varying contrast in the background of the image. These bands, generally referred to as striations can be so noticable as to detract from the quality of the picture.

SUMMARY OF THE INVENTION

This invention provides a method of making CCD imagers such that the image displayed therefrom has a significantly reduced striation contrast level. Starting with a semiconductor wafer initially doped with atoms of one conductivity type, a layer of material adjacent a major surface of the wafer is doped with a substantially laterally uniform concentration of atoms of that one conductivity type. Thereafter, various regions of that layer are doped with conductivity type determining atoms to provide channels along which charge can be transferred. Finally, a channel oxide layer is provided over that major surface and a plurality of generally parallel electrodes extending generally transverse to the channels are provided over the channel oxide layer.

Preferably, the layer is doped by ion implantation of atoms of the one conductivity type to a predetermined depth into the wafer and, thereafter, the atoms are diffused deeper into the wafer.

BRIEF DESCRIPTION OF THE DRAWING

For a better understanding of the invention, reference is made to the following description of a preferred embodiment thereof, taken in conjunction with the figures of the accompanying drawing, in which.

DETAILED DESCRIPTION OF A PREFERRED EMBODIMENT

Figure 1:
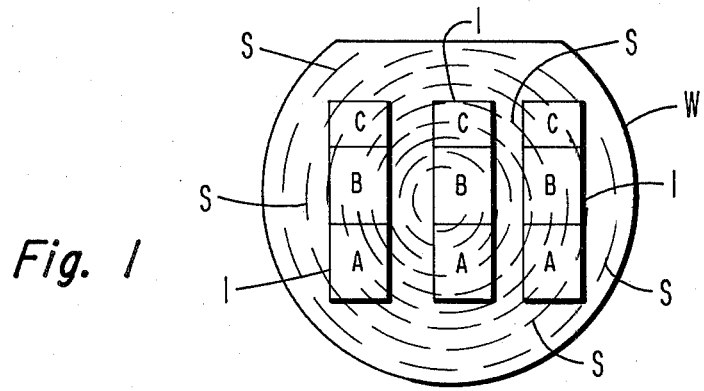
FIG. 1 is a top plan view schematically illustrating a generally conventional semiconductor wafer on which a plurality of CCD imagers are formed.

In FIG. 1 there is schematically illustrated a semiconductor wafer W, most usually silicon, on which three CCD imagers I are formed. The imagers I are the same and generally include various regions doped with N type conductivity atoms and other regions doped with P type conductivity atoms so as to define the various channels along which the charge is stored and transferred. For example, channel stops can be formed between the channels, excess charge or "anti-blooming" drains can be formed in the channel stops and an output transistor amplifier can be formed in the wafer. The configuration of CCD imagers are well known to those skilled in the art and, thus, these regions are not illustrated in FIG. 1 since it is believed they would generally confuse the drawing. FIG. 1 does depict the A, B and C registers normally formed on such devices to facilitate an understanding of the invention.

After a careful investigation of the striation problem in displayed images, it has been discovered that these striations result from a plurality of factors, one of which is the lateral variation in the resistivity of the initial wafer. In the usual methods of making CCD imagers, the starting wafer is generally doped with atoms of one conductivity type, most usually P type. The lateral doping variations or striations in commercially available wafers inherently result from the conventional manufacturing techniques used to form doped silicon boules from which the wafers are cut. In the best commercially available wafers the lateral resistivity variation is in the range of ±10%. These resistivity variations are schematically illustrated by the lines marked with the letter S in FIG. 1. As can be seen, these striations or resistivity variations form a generally circular or nearly concentric swirling pattern in the wafer W. When the imagers I are formed, portions of the striations S are located in the imagers.

When the imagers I are in use, striations in the displayed image follow the striations S in the A register of the imagers. To a significantly lesser extent, the striations S in the B and C imager can also adversely affect the quality of the displayed image. It has been determined that the lateral resistivity variations create lateral electric fields, that is, fields extending generally parallel to the major surface of the wafer. Thus, when light impinges on the A register and generates photocharge, this charge is drifted laterally along the wafer in a non-random manner and thus, not all of the charge generated in any small region is collected in its adjacent potential well formed in a channel. It is this perturbed collection of the generated photocharge that provides the striation contrast in the displayed image.

In accordance with this invention, the striations in the image displayed from a CCD imager are significantly reduced by starting with a wafer of somewhat higher resistivity than that desired for the wafer. Thus, the initial doping concentration of the wafer is reduced. Thereafter, dopant atoms of the same type as that in the starting wafer are implanted and then diffused into the wafer so as to provide a concentration of atoms that is substantially uniform in the lateral direction. Because the concentration is laterally uniform, the effect of lateral fields from the dopant atoms is significantly diminished and the contrast of the striations in the displayed image is significantly reduced. The depth of the laterally uniform doped layer extends from the major surface in which the device is to be formed a distance at least equal to the maximum depth of the depletion regions formed in the channels under the electrodes of the CCD imagers.

Figure 2:
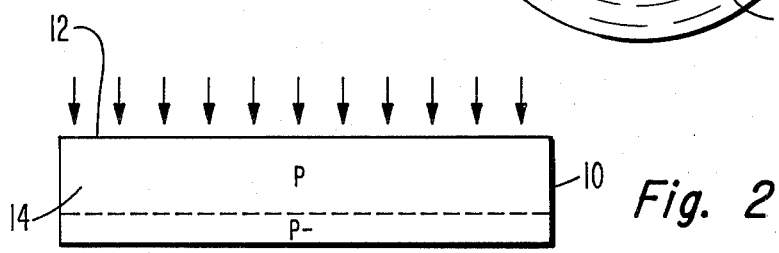
FIG. 2 is a front elevation view of a wafer during the initial stages of a method in accordance with this invention.

Referring to FIGS. 2-7, an example of a method in accordance with this invention is illustrated for forming a buried channel CCD imager. It should be understood that the principles of this invention are equally applicable to surface channel devices. The starting wafer 10 is a silicon wafer doped with P type atoms such as boron. The initial or starting doping concentration of the P type atoms is somewhat less, preferably about 10% or less of that actually desired or normally used for forming the imagers. Thus, the wafer 10 can be nominally doped with P type atoms in a concentration of about $1.4 \times 10^{14}$ atoms/cm$^3$. Typically, in the best commercially available wafers, the doping concentration varies by $\pm 10\%$. As seen in FIG. 2, the same P type conductivity atoms are ion implanted through one major surface 12 of the wafer 10 and are then diffused into the wafer to form a P layer 14 with substantially laterally uniform concentration. The ion implantation can be done through a relatively thin capping oxide layer (not shown), if desired, to protect the surface 12 from unnecessary surface damage which could adversely affect the performance of the devices being formed. The implantation energy is about 150 to about 200 Kev, depending on the capability of the implantation apparatus, and the dose is about $1 \times 10^{12}$ atoms/cm$^2$. After implantation, the wafer 10 is placed in a conventional diffusion furnace where it is slowly heated in a helium or nitrogen ambient to a temperature of about 1100° C. This temperature is maintained for about 72 hours and the wafer is then slowly cooled. This diffusion process drives the atoms into the wafer 10 and activates them while at the same time the surface 12 is annealed to repair any damage thereto caused by the implantation.

The layer 14 thus formed has a composite concentration of boron atoms equal to the sum of the original concentration of the wafer 10, i.e., its nominal concentration, plus the concentration of the atoms implanted and diffused in accordance with this invention. At the surface 12 of the wafer 10, the original doping is, of course, $1.4 \times 10^{14}$ atoms/cm$^3$ with a lateral variation of $\pm 0.14 \times 10^{14}$ atoms/cm$^3$ (the 10% variation) plus $22.9 \times 10^{14}$ atoms/cm$^3$ (the concentration of implanted and diffused atoms as calculated in accordance with well known diffusion equations) with a negligible lateral variation. Thus, the concentration of boron atoms at the surface 12 is $24.3 \times 10^{14}$ atoms/cm$^3 \pm 0.14 \times 10^{14}$ atoms/cm$^3$. By calculation it can be seen that the lateral variation in doping at the surface 12 has been reduced from $\pm 10\%$ to $\pm 0.58\%$.

At a depth of 3 microns below the surface 12, the concentration of atoms implanted and diffused under the conditions described above has been calculated to be $15.8 \times 10^{14}$ atoms/cm$^3$ so that the composite concentration is $17.2 \times 10^{14}$ atoms/cm$^3 \pm 0.14 \times 10^{14}$ atoms/cm ($15.8 \times 10^{14}$ atoms/cm$^3 + 1.4 \times 10^{14}$ atoms/cm$^3 \pm 0.14 \times 10^{14}$ atoms/cm$^3$). At this depth the lateral variation has been reduced from $\pm 10\%$ to $\pm 0.81\%$. At a depth of 5 microns from the surface 12, the concentration of atoms implanted and diffused under the conditions described above has been calculated to be 8.17 atoms/cm$^3$ so that the composite concentration is 9.57 atoms/cm$^3 \pm 0.14 \times 10^{14}$ atoms/cm$^3$. At this depth the lateral variation has been reduced from $\pm 10\%$ to $\pm 1.5\%$.

Moreover, the layer 14 can be seen to extend into the wafer 10 from the surface 12 a distance such that it accommodates the maximum depth of the depletion regions formed in the channels of the CCD array subsequently formed. Accordingly, the effect of lateral fields on the accumulation of photocharge is reduced and provides a corresponding reduction in the striation contrast in displayed images.

At this point, the wafer 10 is ready for further processing to form the CCD imager. Any conventional processing techniques used to form any type CCD imager can now be utilized. With reference to FIGS. 3-7 of the drawing, a particular technique for making a buried channel CCD imager is illustrated. Such an imager includes buried N channel regions (shown generally at 24 in FIG. 7), channel stops (shown generally at 22 in FIG. 7) and excess charge or "anti-blooming" drains (shown generally at 20 in FIG. 7). Continuing with a description of a method in accordance with this invention, after the laterally uniformly doped layer 14 is formed, there is deposited an oxide layer 15 over the surface 12. The oxide layer 15 has a thickness within a range of about 4800 to 5400 Angstroms. The oxide layer 15 can be silicon dioxide (SiO$_2$) thermally grown in an ambient of steam and hydrogen chloride (HCl) at a temperature of about 900° C. for about 5½ hours. After the oxide layer 15 is grown, its exposed surface is covered with a suitable masking layer 16. In carrying out a preferred embodiment of the invention, the layer 16 is a positive type photoresist applied with generally conventional techniques and processed in accordance with generally conventional photolithographic techniques to define protected and unprotected areas over the surface 12. The unprotected areas are located where the drains 20 of the device are to be formed. After photolithographic processing, openings 18 are etched in the areas of the oxide layer 15 adjacent the unprotected areas of the masking layer 16 to expose regions of the surface 12 where the drains 20 are to be formed. A conventional etchant such as buffered hydrofluoric acid (HF) is used.

Figure 3:
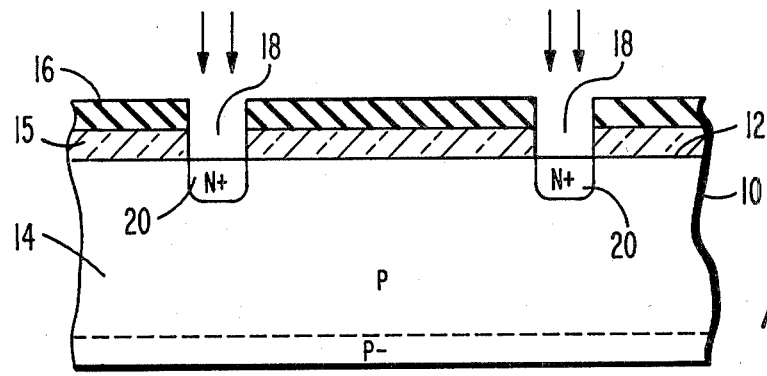
FIGS. 3-6 are section views illustrating additional steps in a method in accordance with this invention.

After the openings 18 are formed, ion implantation techniques are used to deposit a heavy concentration of N type atoms through the openings into the exposed regions of the surface 12. Arsenic (As) is the preferred dopant material because of its relatively slow diffusion rate, but it should be understood that phosphorus or other suitable N type dopant could be used. The arsenic implantation energy is 200 KeV and the dose is $3.6 \times 10^{14}$ atoms/cm$^2$. Typically, the arsenic atoms are implanted to a depth of about 100 Angstroms below the surface 12 and have a concentration of about $7 \times 10^{19}$ atoms/cm$^3$. After the arsenic atoms are implanted, the drains 20 are formed as illustrated in FIG. 3 of the drawing.

Figure 4:
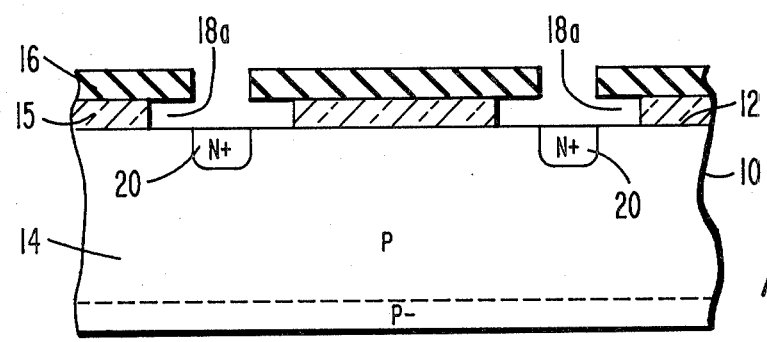
Figure 5:
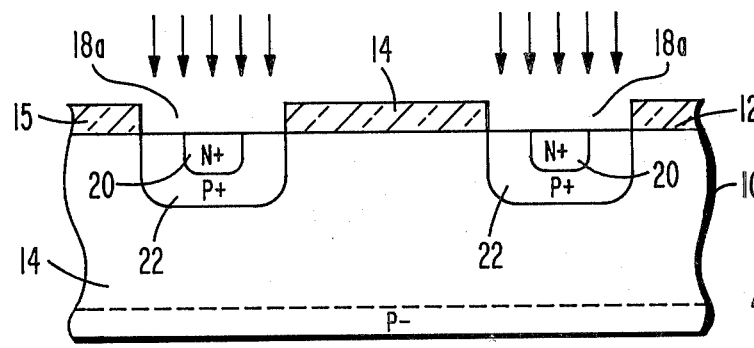

After the drains 20 are formed, the openings 18 in the oxide layer 15 are enlarged as shown at 18a in FIG. 4. Typically, about 3 microns are added to each side of the opening 18. This is accomplished by etching back the oxide layer 15 around the opening 18. A suitable etchant such as buffered hydrofluoric acid is used for about 20 minutes although it should be understood that the time depends on the size of the opening 18a. The hydrofluoric acid etches only the oxide layer 15, but does not etch the photoresist layer 16. It is believed that during the drain implant the arsenic or the phosphorus, if it is used, polymerizes or reacts with the photoresist to make it resistant to the etch. After the openings 18a are formed, the masking layer 16 is stripped from the oxide layer 15 and the wafer 10 is now ready for the formation of the channel stops 22 as illustrated in FIG. 5 of the drawing. Stripping of the photoresist 16 is done in a plasma etch for about 10 minutes. The plasma etch is necessary because the photoresist is otherwise difficult to remove after the implantation of the N type dopant. After the plasma etch, conventional cleaning techniques are used to remove any residue from the oxide layer 15.

Channel stops 22 are formed by depositing P type atoms into the surface 12 through the enlarged openings 18a by ion implantation techniques. Before implanting the channel stops, a very thin capping layer of oxide (not illustrated in the drawing) is formed over the surface regions exposed through the openings 18a. This is accomplished by exposing the wafer 10 to an ambient of steam and hydrogen chloride (HCl) at a temperature of about 900° C. for a period of about 10 minutes. The oxide layer thus formed has a thickness of about 300 to 350 Angstroms and it protects the surface regions from excessive damage during the actual ion implantation of the channel stops 22. It is particularly important to protect the surface regions adjacent the channel stops 22 from damage which could form recombination centers that would drain charge from the channels. The preferred P type dopant is boron and it is implanted with an energy of about 100 KeV in a dose of about $8 \times 10^{11}$ atoms/cm$^2$ to a depth of about 3000 Angstroms so that the channel stops 22 extend below the drains 20 previously formed. The more deeply deposited boron atoms thus surround (as illustrated in FIG. 5) the previously deposited arsenic atoms, but do not convert the material in the region 20 to P type material. The channel stops 22 thus formed have a concentration of about $5 \times 10^{16}$ atoms/cm$^3$ and are located entirely within the layer 14a. Because of the slow diffusion rate of the arsenic used to form the drains 20, it can not diffuse down below the channel stops 22 during subsequent heating steps.

After the boron atoms have been implanted, the arsenic and the boron atoms are activated. That is, the wafer 10 is heated to a temperature of about 1000° C. in an inert ambient such as nitrogen ($N_2$) for a period of about 15 minutes. Such activation anneals the surface 12 of the body 10 repairing surface damage caused by the implantation and also drives the dopant atoms into proper location in the lattice network of the silicon body.

After the activation, the oxide layer 15 is stripped from the surface 12 and another thin capping oxide layer (also not shown in the drawing) is grown in its place in a manner similar to that previously explained. Now, the buried channel regions 24 are formed in the body 10. This too is accomplished by ion implantation techniques and in the preferred embodiment phosphorus atoms are implanted into the surface 12. The implant energy is preferably about 175 KeV with a dosage of about $1.3 \times 10^{12}$ atoms/cm$^2$. The buried channel regions 24, after activation, have a depth of about 2000 Angstroms and a phosphorus concentration of about $10^{17}$ atoms/cm$^3$. As the phosphorus atoms are implanted into the surface 12, they form lightly doped compensation regions 26 in the surface 12 adjacent the channel stops 22. That is, a thin layer of P type material forming the channel stops 22 is converted to a lightly doped N type material surrounding the sinks 20 and spacing the channel stops 22 from the surface 12. The compensation regions 26 extend to a depth of about 500 to 1000 Angstroms. These compensation regions 26 serve to partly control the potential barrier between the buried channel regions 24 and the drains 20 by controlling the location and configuration of the upper edge, i.e., the junction between the channel stops 22 and the compensation regions 26, relative to the surface 12. Ideally, this edge or junction should be relatively wide and parallel to the surface 12 so that a relatively wide, uniform potential barrier is provided. In this way, the effect of any recombination centers in the material between the potential barrier and the surface 12 will be minimized. The use of the ion implantation techniques disclosed here provide this ideal edge.

Figure 7:
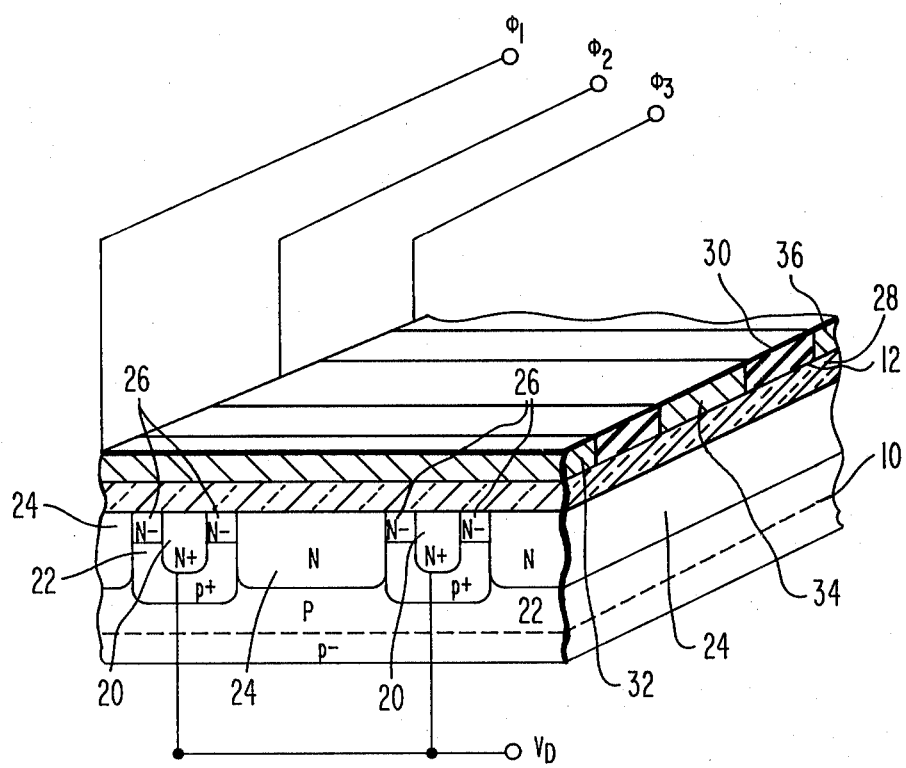
FIG. 7 is a broken away perspective view of a charge coupled device made in accordance with the method of this invention.
Figure 6:
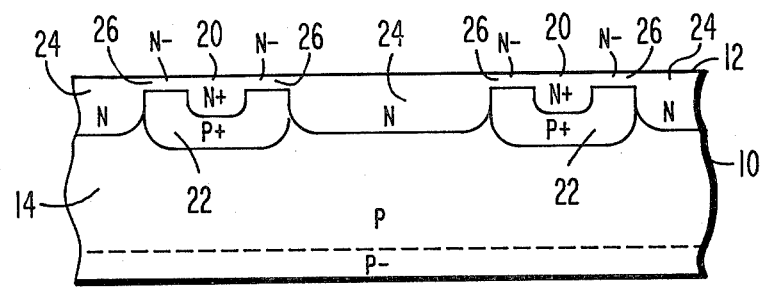

After the wafer has been processed as illustrated in FIG. 6 of the drawing, the capping oxide layer is removed and a channel oxide layer 28 is formed over the surface 12 as shown in FIG. 7. This channel oxide layer 28 is silicon dioxide thermally grown in hydrogen chloride and steam at a temperature of about 900° C. for a period of about 2½ hours. This oxide growth also serves to activate the phosphorus atoms implanted to form the channels 24 and the compensation regions 26 so that no separate activation is needed. Afterwards, a polycrystalline silicon layer 30 is deposited over the channel oxide layer 28 in accordance with conventional techniques, e.g., by a chemical vapor deposition technique using silane ($SiH_4$) and an inert gas. Then, various portions of the polycrystalline silicon layer 30 are doped, e.g., by use of ion implantation techniques, with an N type material to form electrodes 32, 34 and 36 extending parallel to each other and transverse to the channels 24. The electrodes 32, 34 and 36 are connected to a voltage source to provide for three phase operation, but it should be understood that two or four phase operation can also be utilized with appropriate changes. The drains 20 are connected to a positive voltage source to drain any excess charge spilled over from the channels 24 to the drains during operation of the device.

In use, the operation of the device is generally conventional. That is, voltage is sequentially applied to the electrodes 32, 34 and 36 to control potential wells under the electrodes and under the channel regions 24. Radiant energy impinging on the device develops photocharge which accumulates in the wells and is transferred from one well to another as the electrodes 32, 34 and 36 vary the size of the potential wells. The potential barrier between the channel regions 24 and the drains 20 is controlled by the channel stops 22 and the compensation regions 24 and is slightly lower than the potential barrier between storage locations in the channel. Thus, in the event that excess charge is accumulated, it spills over from the channel region 24 to the drains 20 where it is discharged to the potential connected thereto. Because of the substantially uniform lateral concentration of P type atoms in the layer 14, the presence and effect of lateral fields in this layer are significantly diminished. Thus, the photocharge is not drifted laterally from its generation site, but migrates toward its appropriate potential well for accumulation.

While in the foregoing there has been described a preferred embodiment of the invention, it should be obvious to those skilled in the art that various changes and modifications can be made without departing from the true spirit and scope of the invention as recited in the appended claims.

I claim:

1. A method of making a CCD imager having a photosensing register on a semiconductor wafer initially doped with atoms of one conductivity type, the method comprising:
    doping a layer of material adjacent one major surface of said wafer which includes at least the entire portion of the surface containing the photosensing register with a substantially uniform lateral concentration of atoms of said one conductivity type;
    doping regions of said layer with conductivity type determining atoms to provide channels along which charge can be transferred;
    providing a channel oxide layer over said major surface; and
    providing a plurality of generally parallel electrodes extending generally transverse to said channels over said channel oxide layer.

2. A method in accordance with claim 1 wherein said doping of said layer includes implanting ions of said one conductivity type a predetermined depth into said wafer.

3. A method in accordance with claim 2 wherein said doping of said layer further includes diffusing the implanted ions deeper into said wafer.

4. A method in accordance with claim 1 wherein said doping to form said channels includes the doping of first regions of said layer with atoms of said one conductivity type to form channel stops.

5. A method in accordance with claim 4 wherein said doping to form said channels includes the doping of portions of said first regions of said layer with atoms of the opposite conductivity type to form drains.

6. A method in accordance with claims 4 or 5 wherein said doping to form said channels includes the doping of a portion of said layer adjacent said major surface with atoms of the opposite conductivity type to form buried channel regions.

7. A method in accordance with claims 4 or 6 wherein said doping to form said channels is accomplished by implanting ions a predetermined distance into said layer.

* * * * *